United States Patent [19]
Lee

[11] Patent Number: 5,770,096
[45] Date of Patent: Jun. 23, 1998

[54] PATTERN FORMATION METHOD

[75] Inventor: Sang-kyun Lee, Kyungki-do, Rep. of Korea

[73] Assignee: Samsung Aerospace Industries, Ltd., Kyongsangnam-do, Rep. of Korea

[21] Appl. No.: 682,075

[22] Filed: Jul. 17, 1996

[30]  Foreign Application Priority Data

Jul. 18, 1995 [KR] Rep. of Korea ...................... 95-21105

[51] Int. Cl.$^6$ ..................................................... G03C 5/00
[52] U.S. Cl. ............................. 216/41; 430/323; 437/229
[58] Field of Search ........................ 156/625.1; 437/192, 437/229; 430/323; 216/41

[56]  References Cited

U.S. PATENT DOCUMENTS 4,583,218  4/1986  Ghezzo et al. ....................... 156/643.1
5,426,016  6/1995  Fujioka et al. .......................... 430/323

*Primary Examiner*—John Goodrow
*Attorney, Agent, or Firm*—Finnegan, Henderson, Farabow, Garrett & Dunner, L.L.P.

[57] ABSTRACT

The present invention provides a pattern formation method comprising the steps of forming a plating film of a metal insoluble in an etching solution on a substrate, forming a photoresist film on the plating film, forming a photoresist pattern by exposing the photoresist film to light using a predetermined pattern of photo mask and then developing, forming a plating film pattern by using the photoresist pattern as a mask, completely removing the photoresist pattern, etching the substrate by using the plating film pattern as an etching mask, and completely removing the plating film pattern. The present invention has an advantage in that an accurate and fine processing of the lead frame is possible since a plating film pattern is substituted for a photoresist pattern, as an etching mask in the substrate etching step.

11 Claims, 3 Drawing Sheets

PATTERN FORMATION METHOD

BACKGROUND OF THE INVENTION

The present invention relates to a method for forming a pattern by etching, and more particularly, to a method for forming a predetermined pattern using a plating film pattern as an etching mask in forming a pattern by etching.

Etching technology is applied to various technological fields, such as manufacturing a printed circuit board, the shadow mask of a cathode ray tube and a semiconductor component known as a "lead frame." Conventionally, such a processing method is used under the necessity of processing a material in a complex pattern. In the present application, a pattern formation method by etching will be explained by describing a method for manufacturing a lead frame, as one example of the uses of the method in various technological fields.

The lead frame, which is an essential part of a semiconductor device, serves to transmit electrical signals of the semiconductor device to external circuitry and to mechanically support the semiconductor device as an independent component. In general, the lead frame is composed of a base for supporting a semiconductor chip, an inner lead wire bonded to the semiconductor chip, and an outer lead for connecting the inner lead to the external circuitry. When manufacturing a lead frame by known etching methods, a photoresist is deposited on the surface of a substrate, methods, a photoresist is deposited on the surface of a substrate, exposed using a mask, and developed, to thereby form a photoresist pattern. Finally, a lead frame is formed by etching the exposed portions of the substrate with the photoresist pattern as an etching mask, using an etchant. At this time, the etchant is usually sprayed on the upper and lower sides of the lead frame substrate with a constant pressure.

In FIG. 1, a flowchart shows a method of forming the lead frame according to the prior art. Photoresist (a light-sensitive polymer resin) is coated on a pretreated metal substrate in order to form a pattern. Generally, photoresist materials are classified as liquid or dry photoresists. The former is formed by mixing a water-soluble resin, such as casein or polyvinyl, and photo-sensitive agent, such as a dichromate, in a predetermined ratio. Such a liquid photoresist is deposited to a thickness of about 5~10 $\mu$m on the substrate. Thereafter, the photoresist undergoes an exposing step in which the surface coated with the photoresist is irradiated with a photo mask being placed between the substrate and a light source. During the exposing step, the exposed photoresist portions are crosslinked, but the unexposed portions thereof remain unreactioned.

Then, in the next developing step, the unexposed portions are generally removed by spraying a developer. Thus, the crosslinked portions form a photoresist pattern, without being removed due to the difference in solubility.

After the developing step, an etching operation is carried out by spraying an etching solution under high pressure onto the substrate. The developed pattern acts as an etching mask for the pattern formation in the etching process since it is insoluble in the etching solution.

However, there are some problems in the manufacture of the lead frame according to the etching method of the prior art. First of all, it is difficult to manufacture a high pitched lead frame. Since the inner lead pitch becomes far more reduced than the outer lead pitch, a very accurate operation is needed for forming the lead frame by means of the above-described etching. If the photoresist is coated to the thickness of 5~10 $\mu$m on the metal substrate of the lead frame, such fine processing becomes difficult since the photoresist thickness is relatively large compared to the lead pitch. In addition, a photoresist pattern can be damaged by insufficient etching resistance of the liquid photoresist. This can result in an over-etched pattern during the etching operation. Moreover, when the etching solution is sprayed under high pressure, an extra-etched pattern may be obtained due to the damage in the photoresist pattern.

SUMMARY OF THE INVENTION

In order to solve such problems, it is an object of the present invention to provide a method for forming a pattern using a plating film pattern as an etching mask.

It is another object of the present invention to provide a method of manufacturing a lead frame by etching using a plating film pattern as an etching mask.

In order to accomplish the first object, there is provided a pattern formation method comprising the steps of forming a plating film of a metal insoluble in an etching solution on a substrate, forming a photo-sensitive resist film on the plating film, forming a resist pattern by exposing the resist film to radiation using a predetermined pattern of photo mask and then developing, forming a plating film pattern by using the resist pattern as a mask, removing the resist pattern, etching the substrate by using the plating film pattern as an etching mask, and removing the plating film pattern.

Preferably, the plating film is formed by an electrolytic plating process, and the plating film pattern removal is performed by applying current in a reverse direction to a current direction applied for plating.

In order to accomplish the second object, there is provided a method of manufacturing a lead frame, comprising the steps of forming a plating film of a metal insoluble in an etching solution on a lead frame substrate, forming a radiation-sensitive resist film on the plating film, forming a resist pattern by exposing the resist film to radiation using a predetermined pattern of photo mask and then developing, forming a plating film pattern by using the resist pattern as a mask, removing the resist pattern, etching the substrate by using the plating film pattern as an etching mask, and removing the plating film pattern.

Preferably, the plating film is formed by an electrolytic plating, and the plating film pattern removal is performed by applying current in a reverse direction to a current direction applied for a plating.

It is preferable that the plating film thickness is 0.1~1 $\mu$m.

Preferably, the lead frame substrate is formed of one material selected from the group consisting of copper, iron, nickel, and stainless alloy, and the plating film is formed of one metal selected from the group consisting of gold, silver and palladium.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

In a preferred embodiment, the method begins with a plating step conducted by covering a pretreated lead frame substrate with a plating material insoluble in an etching solution. It is preferable that gold, silver, or palladium is used in the plating, although any plating metal insoluble in the etching solution can be used. In particular, if copper, nickel, stainless, or iron alloy is used as the lead frame substrate, it is most preferable that silver is used as the plating metal in consideration of cost and electroconductivity. Also, it is preferable that the plating is carried out by precipitating the plating metal from a solution having the plating metal therein electrolytically rather than non-electrolytically. Here, the thickness of the plating film is about 0.1~1 $\mu$m.

After the plating operation, coating of a photo-sensitive material, such as photoresist, is performed on the plating film. Exposing and developing steps are then conducted after the formation of a photoresist film in a manner similar to the conventional art. The exposing step can employ visible light radiation, ultraviolet radiation, or other radiation as is well-known in the art.

FIGS. 3A–3F illustrate the method of the preferred embodiment. In FIGS. 3B through 3F, hatched portions with full slanting lines represent the removed portions.

Figure 1:
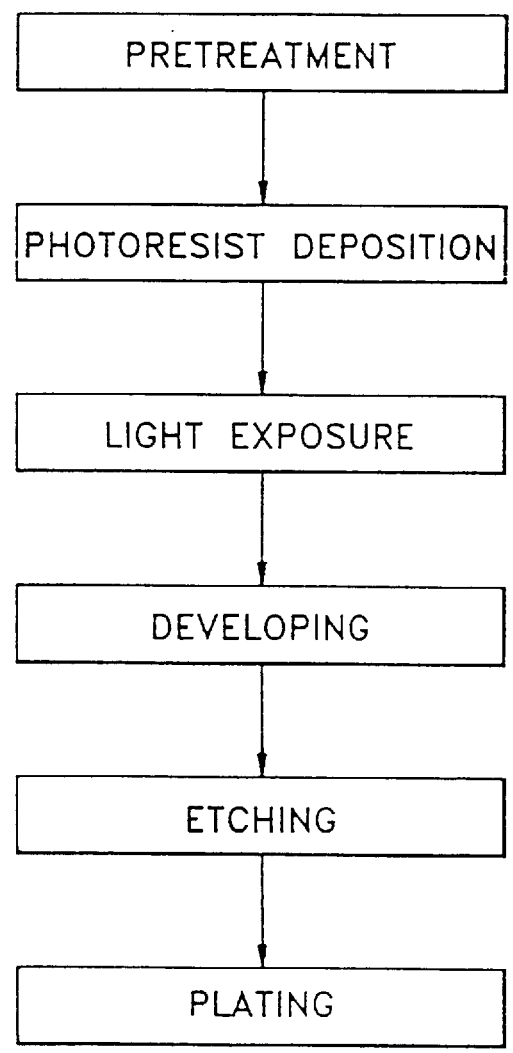
FIG. 1 is a flowchart of a lead frame manufacturing method according to the prior art.
Figure 2:
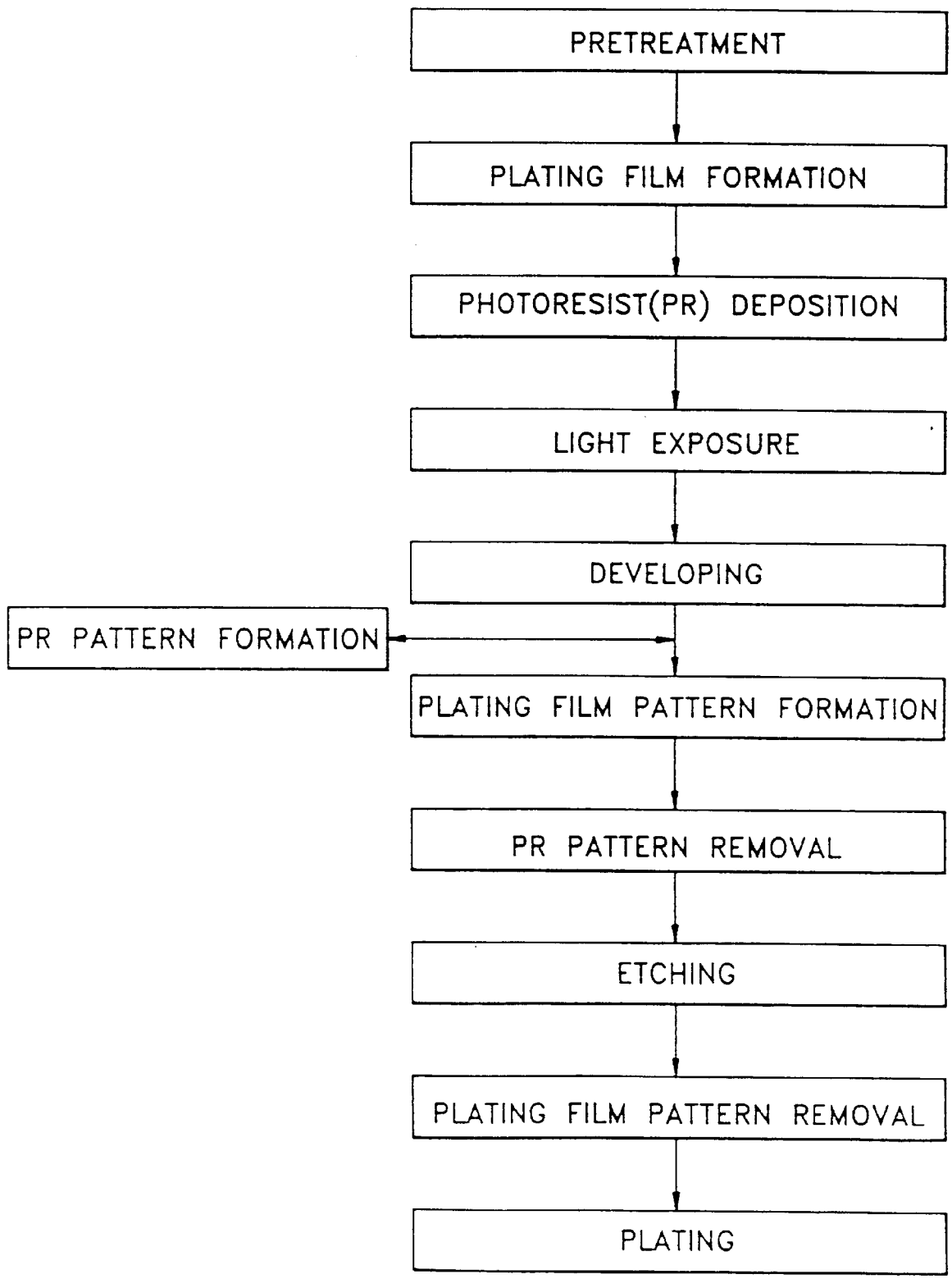
FIG. 2 is a flowchart of a lead frame manufacturing method according to the present invention.
Figure 3A:
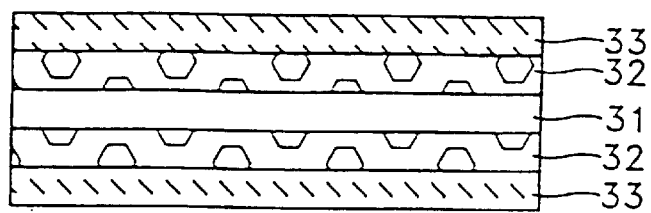
FIGS. 3A through 3F are sectional views for the steps of manufacturing the lead frame according to the present invention.
Figure 3B:
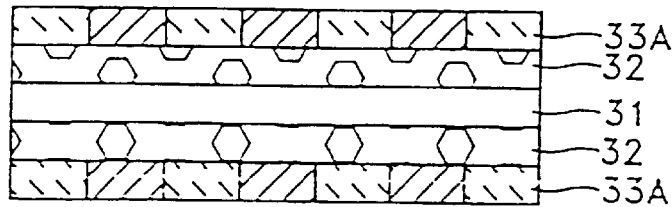

FIGS. 3A and 3B show a step of forming a resist film pattern on a substrate having a plating film formed thereon. Here, a plating film 32 is formed on the upper and lower sides of a substrate 31, and then a photoresist film 33 is formed thereon. The photoresist film 33 is exposed to light using a mask (not shown) and developed, to thereby form a photoresist pattern 33A.

Figure 3C:
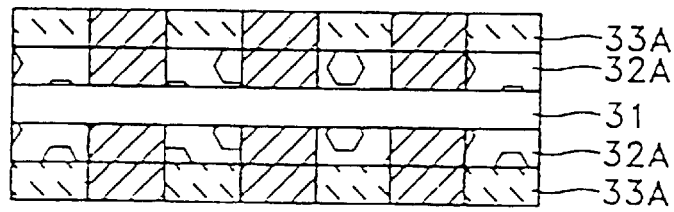

FIG. 3C shows a step of forming a plating film pattern. A plating film pattern 32A is formed by applying current in a reverse direction to a current direction applied for the plating, using the photoresist pattern 33A as a mask. That is, the plating film portions covered with the photoresist pattern 33A are not removed by the reverse current, while the exposed plating film portions are removed by the reverse current. Thus, the plating film pattern 32A is formed in the same pattern as the photoresist pattern 33A.

Figure 3D:
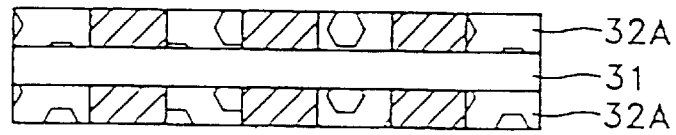

FIG. 3D shows a step of removing the photoresist pattern 33A. After forming the plating film pattern 32A, the photoresist pattern 33A is removed. The removal of the photoresist pattern 33A is carried out using a sodium hydroxide solution according to the prior art. Preferably, the photoresist pattern 33A is completely removed, and the predetermined pattern of the plating film pattern 32A is then formed to a thickness of about 0.1~1 $\mu$m on the lead frame substrate.

Figure 3E:
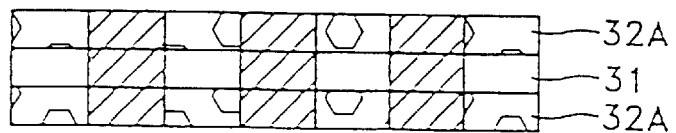
Figure 3F:
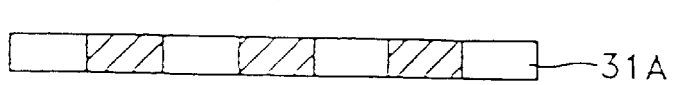

FIG. 3E shows a step of etching the substrate. The etching of the lead frame substrate is performed by using the plating film pattern 32A as an etching mask. Since the plating film is made of a material insoluble in the etching solution as described above, the exposed lead frame substrate portions which are not covered with the plating film pattern 32A are etched. Accordingly, a predetermined pattern same as the photoresist pattern 33A is formed on the substrate 31. Once the lead frame substrate 31 is formed in the predetermined pattern, the plating film pattern 32A is removed. Preferably, the plating film pattern 32A is completely removed by applying the reverse current as mentioned before. Since the photoresist pattern 33A has been completely removed, the plating film pattern 32A remaining on the lead frame substrate 31 is easily removed by the reverse current, to thus form a predetermined pattern of lead frame substrate as shown in FIG. 3F.

After the complete removal of the plating film, an additional plating may be performed. This optional plating, such as gold plating, may be performed on a predetermined portion of the lead frame so as to provide the necessary quality for the completed lead frame.

The pattern formation method according to the present invention and the lead frame manufacturing method as an application embodiment thereof have an advantage in that an accurate and fine processing is possible since the plating film pattern is substituted for the photoresist pattern of the prior art as an etching mask in the substrate etching step. In particular, even if the plating film thickness of 0.1~1 $\mu$m is much thinner than the prior art photoresist film thickness of 5–10 $\mu$m, the hardness of the plating film is stronger than that of the photoresist film. Thus, the plating film pattern resists damaged. In addition, since the plating film has a strong resistance with respect to the etching solution sprayed under high pressure in the etching step, over-etching and under-etching are both prevented, and the spraying pressure of the etching solution can be freely controlled. Further, a strike process as a preliminary process in plating is unnecessary, and inferiorities such as a surface pollution of the substrate can be sharply reduced.

While the pattern formation method according to the present invention has been particularly described with reference to particular embodiment of forming a lead from shown in the drawings, it will be understood by those skilled in the art that various changes and equivalent embodiments of the basic inventive concepts may be available within the protected scope of the present invention as defined in the appended claims.

What is claimed is:
1. A pattern formation method comprising the steps of:
    forming a plating film of a metal insoluble in an etching solution on a substrate;
    forming a photo-sensitive film on said plating film;
    forming a resist pattern by exposing said photo-sensitive film to radiation using a predetermined pattern of a photo mask and then developing;
    forming a plating film pattern by using said resist pattern as a mask;
    etching said substrate by using said plating film pattern as an etching mask.
2. A method as recited in claim 1, wherein the photo-sensitive film comprises photoresist, and the resist pattern formation step comprises exposing the photoresist film to light.
3. A method as recited in claim 1, wherein the resist pattern removal step and the plating film pattern removal step respectively comprise completely removing the resist pattern and completely removing the plating film pattern.
4. A method as claimed in claim 1, wherein said plating film is formed by electrolytic plating, and said plating film pattern formation and plating film pattern removal are performed by applying electric current in a reverse direction to an electric current direction applied for the plating film formation step.
5. A method of manufacturing a lead frame, comprising the steps of:

forming a plating film of a metal insoluble in an etching solution on a lead frame substrate;

forming a photo-sensitive film on said plating film;

forming a resist pattern by exposing said photo-sensitive film to radiation using a predetermined pattern of photo mask and then developing;

forming a plating film pattern by using said resist pattern as a mask;

removing the resist pattern;

etching said substrate by using said plating film pattern as an etching mask; and removing the plating film pattern.

6. A method as recited in claim 5, wherein the photo-sensitive film comprises photoresist, and the resist pattern formation step comprises exposing the photoresist film to light.

7. A method as recited in claim 5, wherein the resist pattern removal step and the plating film pattern removal step respectively comprise completely removing the resist pattern and completely removing the plating film pattern.

8. A lead frame manufacturing method as claimed in claim 3, wherein said plating film is formed by an electrolytic plating, and said plating film pattern formation and plating film pattern removal are performed by applying current in a reverse direction to a current direction applied for a plating.

9. A method as claimed in claim 5, wherein said plating film thickness is about 0.1~1 μm.

10. A method as claimed in claim 5, wherein said lead frame substrate is formed of a material selected from the group consisting of copper, iron, nickel, and stainless alloy, and said plating film is formed of a metal selected from the group consisting of gold, silver, and palladium.

11. The method of claim 1, including the additional step of removing the plating film pattern.

\* \* \* \* \*

UNITED STATES PATENT AND TRADEMARK OFFICE
CERTIFICATE OF CORRECTION

PATENT NO. : 5,770,096
DATED : June 23, 1998
INVENTOR(S) : Sang-kyun LEE

It is certified that error appears in the above-identified patent and that said Letters Patent is hereby corrected as shown below:

In Claim 1, Column 4, line 49, after "mask;", insert the line: --removing the resist pattern; and--.

Signed and Sealed this

Twenty-second Day of June, 1999

Q. TODD DICKINSON

*Attest:*

*Attesting Officer*    *Acting Commissioner of Patents and Trademarks*